United States Patent [19]

McClure

[11] Patent Number: 5,493,537
[45] Date of Patent: Feb. 20, 1996

[54] SEMICONDUCTOR MEMORY WITH EDGE TRANSITION DETECTION PULSE DISABLE

[75] Inventor: David C. McClure, Carrollton, Tex.

[73] Assignee: SGS-Thomson Microelectronics, Inc., Carrollton, Tex.

[21] Appl. No.: 202,830

[22] Filed: Feb. 28, 1994

[51] Int. Cl.[6] ........................................................ G11C 8/00
[52] U.S. Cl. .................. 365/233.5; 365/218; 365/230.06
[58] Field of Search .............................. 365/233.5, 218, 365/230.06, 190; 307/480

[56] References Cited

U.S. PATENT DOCUMENTS

| | | | |
|---|---|---|---|
| 4,872,143 | 10/1989 | Sumi | 365/233.5 |
| 4,891,793 | 1/1990 | Anami | 365/233.5 X |
| 4,922,461 | 5/1990 | Hayakawa et al. | 365/230.08 |
| 5,047,985 | 9/1991 | Miyaji | 365/203 |
| 5,124,584 | 6/1992 | McClure | 307/480 |
| 5,243,575 | 9/1993 | Sambandan et al. | 365/233.5 |
| 5,262,994 | 11/1993 | McClure | 365/200 |
| 5,265,100 | 11/1993 | McClure et al. | 371/21.2 |
| 5,267,210 | 11/1993 | McClure et al. | 365/218 |

Primary Examiner—David C. Nelms
Assistant Examiner—Son Dinh
Attorney, Agent, or Firm—Rodney M. Anderson; Irena Lager; Lisa K. Jorgenson

[57] ABSTRACT

A system and method are provided for disabling the edge transition detection circuit during the flash clear cycle, thereby preventing the generation of an edge transition detection pulse. In a preferred embodiment of the invention, the edge transition detection circuit is connected to the flash clear complement circuitry through a logic gate. During the flash clear cycle, flash clear true, $FC_T$, is pulled high, flash clear complement, $FC_c$, is pulled low and inverted to drive a portion of the ETD circuitry high, thereby preventing generation of an ETD pulse during the flash clear cycle.

23 Claims, 2 Drawing Sheets

SEMICONDUCTOR MEMORY WITH EDGE TRANSITION DETECTION PULSE DISABLE

BACKGROUND OF INVENTION

1. Field of the Invention

The present invention is in the field of integrated circuits, particularly semiconductor memory circuits, and is more particularly directed to the disabling of edge transition detection pulses during flash clear of the memory array.

2. Description of the Prior Art

Semiconductor memories, such as random access memories (RAMs) and read-only memories (ROMs) are typically designed to operate in response to input signals in either a clocked or an asynchronous (unclocked) manner. One type of integrated circuit which operates primarily on asynchronous signals is a static random-access memory (SRAM). SRAMs are designed to receive address values at address terminals, and to statically provide read or write access to memory cells corresponding to the value of the address applied thereto, without relying on a clock signal indicating that the value at its address terminals is valid.

Many modern SRAMs now include edge transition detection (ETD) circuits such as address transition detection (ATD) circuitry and other timing and control circuits that provide the SRAM device with performance benefits of internal dynamic operation. An ETD circuit detects transitions within the device and generates internal signals or "pulses" responsive to detecting such transitions.

For example, the use of an ATD circuit allows the SRAM circuit to perform certain internal operations, such as precharging bitlines or deselecting sense amplifiers, after detection of the address transition, but before the decoders access the desired cell. Upon presentation of a new memory address to the SRAM, the transitions at the address terminal cause the ATD circuit to enable the necessary functions of the SRAM to access the memory cells selected by the new memory address. An example of an ATD circuit used in SRAMs is described in U.S. Pat. No. 5,124,584, issued on Jun. 23, 1993, assigned to SGS-Thomson Microelectronics and herein incorporated by this reference.

The design of SRAM circuits to respond to unclocked signals increases the sensitivity of the device to noise or other spurious signals, thereby causing performance degradation, decreased reliability, or other serious problems. Consider, for example, an SRAM device incorporating a flash clear cycle in its architecture. Flash clear is of particular utility in SRAMS used in computer cache memories. Also known as flash write, flash clear is used to write to all memory cells (or selected cells) simultaneously. A computer cache memory duplicates selected data from the main memory allowing a computer central processing unit (CPU) faster access to that data than can be obtained from a system's main memory. The protocol for selection of the data to be duplicated is critical to the effective operation of the cache. The flash clear operation can be used to clear all resident data from SRAMS of the cache, such as in tag arrays or data storage, where a selection protocol requires such an operation.

Initiation of a flash clear cycle results in relatively large currents on an SRAM. Current transients may be in the range of amperes, bordering on capacity limitations of the devices involved. If an ATD circuit or other timing and control circuit generates an edge transition detection pulse, a serious problem may occur. For example, if an address or clock changes state, an edge transition detection pulse (ETD) is generated. This pulse is frequently used to short bitline true to bitline complement and precharge both to $V_{cc}$ (or $V_{cc}-V_{TN}$) in many devices. If this occurs during a flash clear, a crowbar condition is created on every column cleared, generating "beyond capacity" crowbar currents throughout the device.

Conventional system designs combat these problems by making any address or clock change illegal during the flash clear. This can be rather restrictive in the system environment, however, and does not reliably prevent oscillations or noise from initiating an internal edge transition detection pulse. In addition, the flash clear cycle can cause huge current transients (both AC and DC). Noise induced by the transients can cause temporary input transitions (internal to the part) even when the signal is static external to the device. The false transition, which can generate a false ETD pulse, causing ever larger current transients, more noise, more false transitions, resulting in oscillations disruptive to the proper functioning of the SRAM device.

Therefore, it would be desirable to have a method and system for temporarily disabling edge transition detection circuitry during the flash clear cycle to protect the device from transient currents, noise and other harmful effects.

SUMMARY OF THE INVENTION

According to the present invention, a method and system are provided for disabling edge transition detection pulses during the flash clear cycle.

The invention may be incorporated into an integrated circuit by way of a method and system which prohibit the edge transition detection circuit from generating a pulse during the flash clear cycle. In a preferred embodiment of the invention, the edge transition detection circuit is connected to the flash clear complement circuitry through a logic gate. During the flash clear cycle, flash clear true, $FC_T$, is pulled high, flash clear complement, $FC_c$, is pulled low and inverted to drive a portion of the ETD circuitry high, thereby preventing generation of an ETD pulse during the flash clear cycle.

Other objects and advantages of the present invention will be apparent to those of ordinary skill in the art having reference to the following specification together with the drawings.

BRIEF DESCRIPTION OF THE DRAWINGS

The invention is further described and explained in relation to the following figures of the drawings wherein.

DESCRIPTION OF THE INVENTION

Figure 1:
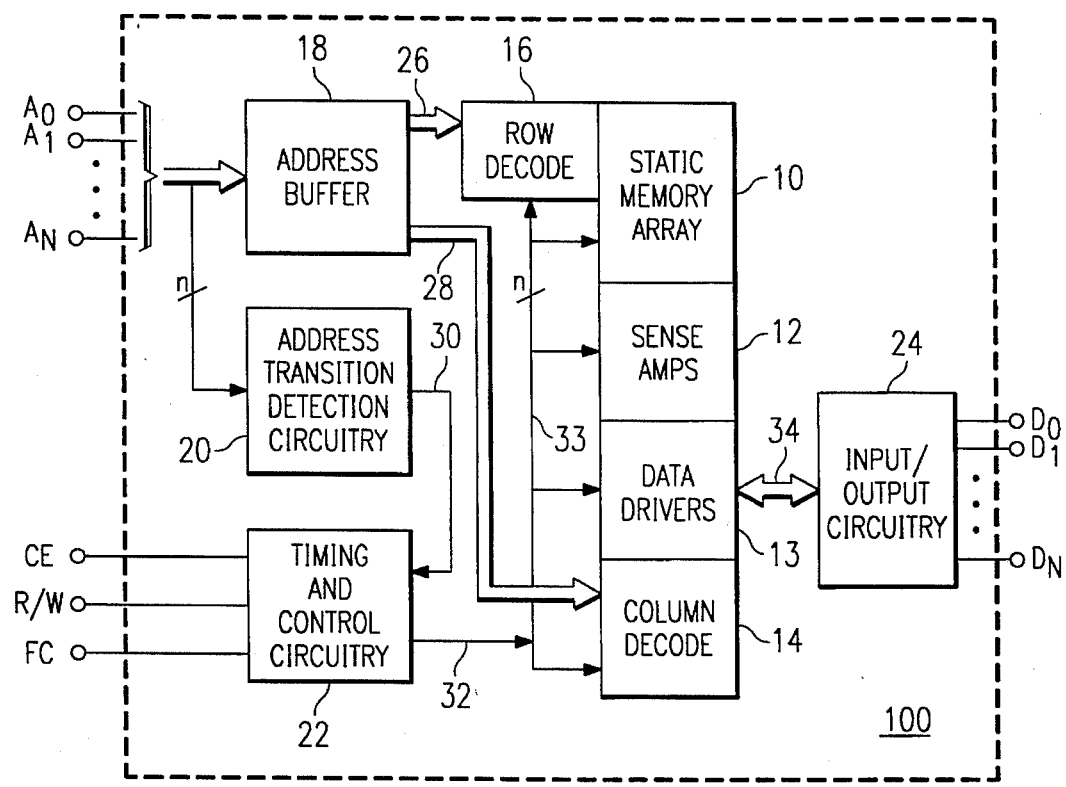
FIG. 1 is an electrical diagram, in block form, of a memory incorporating a preferred embodiment of the invention.

Referring now to FIG. 1, an example of an integrated circuit into which a preferred embodiment of the invention is implemented will be described. In this example, memory 100 is a static random access memory (SRAM) of otherwise conventional architecture, having a plurality of memory cells located within static memory array block 10. It is contemplated that integrated circuits of various types having flash clear capabilities may also benefit from the present invention. Such integrated circuits include, for example, read-only memories, FIFOs, DRAMs and the like, as well as microprocessors and other logic devices with edge transition detection circuits.

Address terminals $A_o$ through $A_N$ receive an address signal according to which the memory cells of array 10 to be accessed are designated. The number and placement of memory cells within array block 10 may vary from implementation to implementation according to the desired functionality of the device. Examples of the configuration and operation of conventional semiconductor memories into which the present invention may be incorporated are described in U.S. Pat. No. 5,262,994, issued Nov. 16, 1993, and U.S. Pat. No. 5,265,100, issued Nov. 23, 1993, both of which are assigned to SGS-Thomson Microelectronics, Inc., and incorporated herein by this reference.

In the conventional manner, address terminals $A_o$ through $A_N$ are connected to address buffers 18, which buffer the received address signal and communicate a portion of the address signal to row decoder 16 on row bus 26, and communicate the remainder to column decoder 14 on column bus 28. Bus 26, 28 access individual memory cells or groups of memory cell arrays within array 10.

Figure 2:
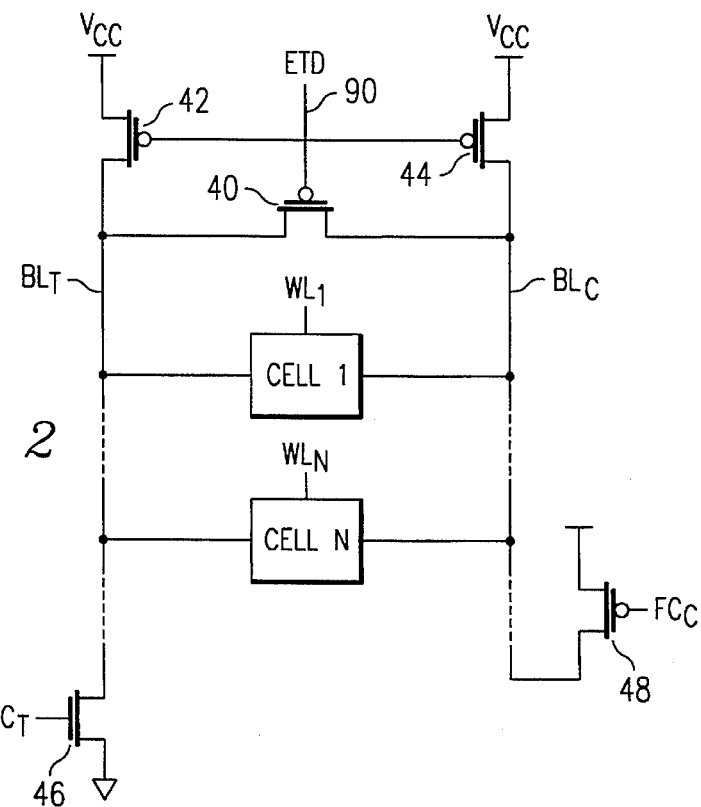
FIG. 2 is an electrical diagram, in block form, of a portion of a memory cell array such as the static memory array shown in FIG. 1.

Memory circuits which utilize static memory arrays, such as array 10, are generally organized in rows and columns. A section of one such column is shown in FIG. 2. In typical SRAMs, a row select line, generally decoded from a row address value, connects each of a number of memory cells associated with the row address value to a pair of bitlines (true and complement). Referring to FIG. 2, these bitlines are designated $BL_T$ and $BL_c$, respectively. Each pair of bitlines are associated with a column of memory cells, $Cell_1$ through $Cell_N$. During read/write operations, the bitline pairs, $BL_T$, $BL_c$, communicate differential signals between memory cells and the corresponding input/output circuitry such as sense amplifiers 12 or data drivers 13 which, in turn, drive data bus 34. Referring back to FIG. 1, data bus 34 includes data conductors (not shown) which communicate with input/output terminals $DQ_o$ through $DQ_N$ and are coupled thereto via input/output circuitry 24.

Memory 100 of FIG. 1, as is the case of most modern SRAMs and DRAMs, includes some amount of internal dynamic operation, such as precharging and equilibration of certain nodes (e.g., the bitlines) at particular points in the memory cycle. Initiation of the cycle in memory 100 occurs by way of address transition detection, performed by address transition detection (ATD) circuit 20. ATD circuit 20 is connected to each of the address inputs, $A_o$ through $A_N$, and generates a pulse on ATD line 30 responsive to detecting a transition at any one or more of the address inputs. An example of ATD circuit 30 into which the present invention may be incorporated is described in U.S. Pat. No. 5,124,584, issued Jun. 23, 1993, assigned to SGS-Thomson Microelectronics, Inc., and incorporated herein by this reference.

Other internal operational functions are controlled by timing and control circuitry 22, which receives the signal on line 30 from ATD circuit 20, and which also receives certain external control signals such as the chip enable signal at terminal CE, the read/write select signal at terminal R/W, and the flash clear signal at terminal FC. As shown in FIG. 1, control bus line 33 is connected between timing and control circuitry 22, sense amplifiers 12 and data drivers 13. Other functions are similarly controlled by timing circuitry 20 using conventional methods, with their connections not shown in FIG. 1 for purposes of clarity.

It should be noted that ATD circuit 20 and timing and control circuitry 22 are generally not particular blocks of circuitry as suggested in FIG. 1. Instead, these circuits are typically distributed throughout memory 100 to control operation of various portions within. Examples of alternate methods and circuits for sending and controlling input signals throughout a device are described in copending applications Ser. No. 085,751, filed Jun. 30, 1993, and Ser. No. 995,580, filed Dec. 22, 1992, both of which are assigned to SGS-Thomson Microelectronics, Inc. and incorporated herein by this reference.

Referring now to FIG. 2, the operation of a flash clear cycle will now be described. FIG. 2 depicts a column of a memory cell array of static memory array 10 of FIG. 1. The column of memory cells, $Cell_1$ through $Cell_N$, is coupled between ETD control signal 90 and flash clear true and complement control signals, $FC_T$, $FC_c$, via bitline pair $BL_T$, $BL_c$, and transistors 40, 42, 44, 46, 48. Transistor 46 is a conventional n-channel transistor in series with p-channel transistor 42 having the series conduction path coupled between $V_{cc}$ and $V_{ss}$ along $BL_T$. Transistor 48 is a conventional p-channel transistor in series with p-channel transistor 44. The conduction path of transistors 44, 48 is connected to $V_{cc}$ along $BL_c$. The gates of transistors 46, 48 are controlled by $FC_T$ and $FC_c$ signals, respectively, whereas, ETD control signal 90 operates the gates of equilibrate transistor 40 and precharge transistors 42, 44.

Referring briefly to FIG. 1, the signal from the flash clear input terminal FC is communicated to memory cells of array 10 via control bus line 33. As shown in FIG. 2, flash clear control signals, $FC_T$ and $FC_c$, operate to preset all selected memory cells, $Cell_1$ through $Cell_N$, to logic 0. The memory cells are selected by pulling the associated wordlines, $WL_1$ through $WL_N$, high. Upon initiation of the flash clear cycle, signal $FC_T$ goes high to pull $BL_T$ low, maintaining transistor 46 on while signal $FC_c$ goes low, turning transistor 48 on and pulling $BL_c$ high, thereby writing to all selected cells at the same time.

The flash clear cycle desrcibed herein is by way of example only and not limitation. It will be understood and appreciated by one skilled in the art that other means of performing flash clear, such as with conventional write circuitry, can be used in conjunction with the present invention. Furthermore, it should be noted that application of the flash clear signal to one column as shown in FIG. 2 is also by way of example only. The embodiments of the invention may be applied to disable the ETD circuit during operation of any type of flash clear cycle, i.e. all memory cells or selected memory cells. Further detailed examples of the operation of flash clear in conventional SRAMs are provided in copending U.S. Pat. application, Ser. No. 08/100,084, filed on Jul. 30, 1993, and U.S. Pat. No. 5,267,210, issued on Nov. 30, 1993, both of which are assigned to SGS-Thomson Microelectronics, Inc., and are herein incorporated by reference.

As can be seen from examination of FIG. 2, if an ETD pulse, whether false or otherwise, is generated while $FC_T$ is high and $FC_c$ is low, a crowbar condition is created on the bitlines of each and every column being cleared; therefore, problematic large crowbar currents can be realized, leading to hugh current transients (both AC and DC). Although device specifications can prohibit input transitions during a flash clear cycle, such a method is restrictive and does not eliminate all problematic pulses such as those caused by noise within the device. Noise induced by the current transients during a flash clear cycle can cause temporary input transitions (internal to the part) even when the input signal is static external to the device. The false transition can generate a false ETD pulse, causing larger current transients and additional noise, thereby perpetuating oscillations of increasingly dangerous magnitude which may result in decreased reliability or device failure.

The method of the invention eliminates the aforementioned problems by preventing generation of an ETD pulse, false or otherwise, during a flash clear operation. In a preferred embodiment of the present invention, ETD circuitry operates conventionally to detect address or other signal changes and to generate corresponding ETD pulses. Upon initiation of the flash clear cycle, however, a signal is sent to isolate the ETD circuitry and prevent it from generating ETD pulses during the flash clear cycle.

Figure 3:
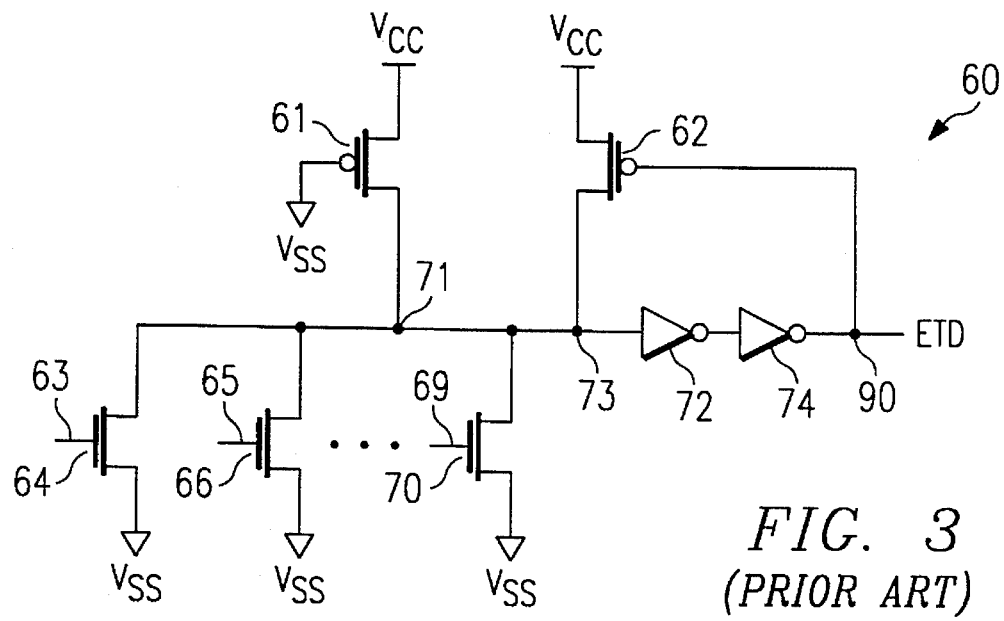
FIG. 3 is an electrical diagram, in schematic form, of a conventional edge transition detection circuit.

Referring now to FIG. 3, the operation of conventional ETD circuitry 60 will now be described. Consider the example where gate signals 63, 65, and 69 correspond with address signals $A_o$ through $A_N$. The conduction paths of n-channel control transistors 64, 66, 70 are in parallel with each other and are tied in series between p-channel transistor 61 and $V_{ss}$. With its gate pulled to $V_{ss}$, and its conduction path coupled between $V_{cc}$ and node 71, transistor 61 acts as a constant force on node 71, pulling it toward a high logic state. When any one of control transistors 64, 66, 70 conducts because its gate signal 63, 65, or 69, respectively, receives a high going pulse derived from a transition on an address, $A_o$ through $A_N$, node 73 is pulled to a low logic state ($V_{ss}$). Node 73 feeds the input of inverter 72 causing inverter 72 to output a high logic state to the input of inverter 74. Therefore, the output signal 90 of inverter 74 goes to a low logic state, p-channel transistor 62 is turned on, and node 73, is correspondingly pulled to a high logic state. This effectively sums all the individual pulses received from each address. When node 73 is pulled up to a sufficiently high logic state, output signal 90 returns to a high logic state and transistor 62 turns off, thereby completing the pulse generation cycle at output 90.

Figure 4:
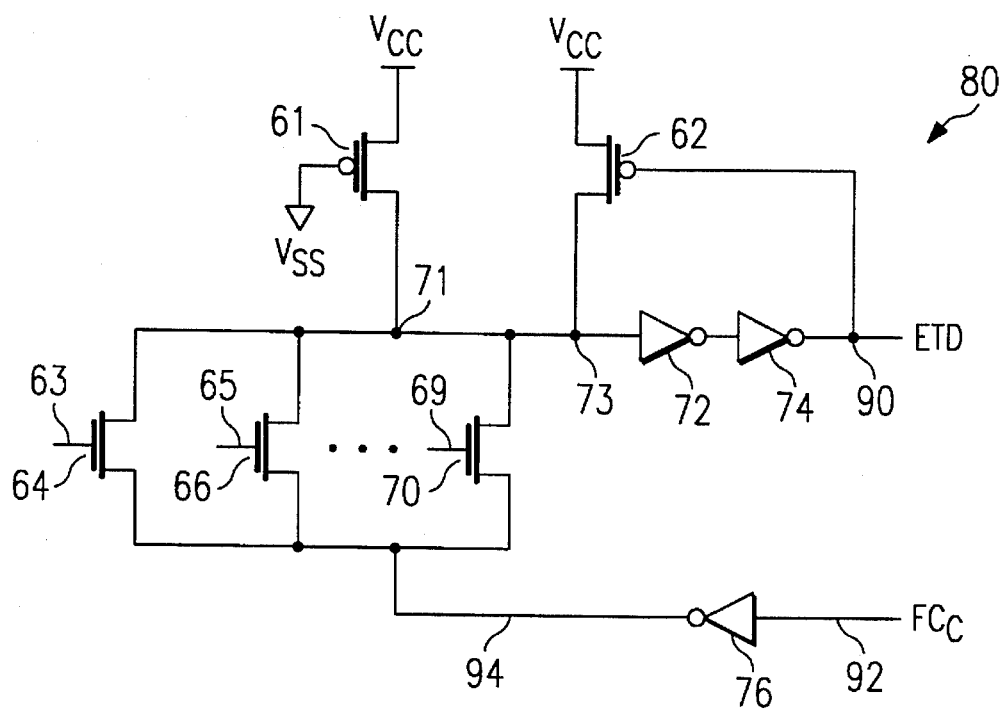
FIG. 4 is an electrical diagram, in schematic form, of an edge transition detection circuit incorporating a preferred embodiment of the invention.

A preferred embodiment of the invention will now be detailed, with reference to FIG. 4, through a description of the operation of ETD circuit 80. The same reference numerals are used to identify like parts between FIGS. 3 and 4. It will be understood and appreciated by one skilled in the art that the present invention may be incorporated into a variety of conventional ETD circuits. For example, control transistors 66, 67, and 70 may be n-channel or p-channel MOS transistors, bipolar transistors, or any other switching elements. In addition, the number of transistors or switching elements placed in the ETD circuit will be dictated by the specific design and performance characteristics of the device incorporating the present invention.

Referring to FIG. 4, consider an example using an ETD circuit similar to that shown in FIG. 3, where gate signals 63, 65, and 69 correspond with address signals $A_o$ through $A_N$. The conduction paths of n-channel control transistors 64, 66, 70 remain connected in parallel with each other; however, with the placement of logic element 76 in the circuit as shown, control transistors 64, 66, 70 are now coupled in series between p-channel transistor 61 and the output of element 76. In addition, the input of logic element 76 is controlled by $FC_c$ signal 92.

It will be understood by one skilled in the art that different types and numbers of conventional logic elements may be substituted for element 76 as shown in FIG. 4. Specifically, logic element 76 can be any one or plurality of logic elements such as inverters or NOR gates. Such logic elements will be chosen according to the design and performance specifications of the device incorporating the present invention.

In the example of FIG. 4, logic element 76 consists of a large N-channel inverter. In this configuration, the sources of n-channel control transistors 64, 66, 70 are connected to the output of logic element 76 and are now "clocked" based on the logic state of $FC_c$. During standard device operation, (e.g. not during a flash clear cycle) ETD circuit 80 operates similarly to ETD circuit 60. Upon initiation of a flash clear cycle, however, the functioning of the system changes. Transistor 61, still acts as a constant force on node 71, pulling it toward a high logic state. During the flash clear cycle, $FC_c$ signal 92 inputs a low logic state to inverter 76. Inverter 76 generates and maintains a high logic level at output signal 94 throughout the duration of the flash clear cycle (e.g. $FC_c$ maintained at a low logic state). Specifically, output 94 acts to drive and maintain the source of ETD control transistors 64, 66, 70 to a high logic state, thereby preventing any of n-channel transistors 64, 66, 70 from conducting and pulling node 73 low if its gate signal 63, 65, or 69, respectively, receives an address pulse or other false or spurious noise. Upon completion of the flash clear cycle, input signal 92 changes to a high logic state and output signal 94 returns to a low logic state, $V_{ss}$, thereby permitting free operation of the ETD circuit 80 of FIG. 4 as described for ETD circuit 60 in FIG. 3.

As disclosed herein, the preferred embodiment of the invention permits operation of the flash clear cycle while eliminating hazardous ETD pulse generation. While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of operating an integrated circuit so as to prevent generation of a signal internal to the integrated circuit based upon an edge transition detection pulse, comprising the steps of:

initiating a flash clear cycle having a flash clear output signal;

disabling an edge transition detection circuit from generating the edge transition detection pulse responsive to a transition at one of a plurality of inputs of the integrated circuit during operation of said flash clear cycle; and after completion of said flash clear cycle, enabling said edge transition detection circuit to generate the edge transition detection pulse responsive to a transition at one of the plurality of inputs of the integrated circuit.

2. The method of claim 1 wherein said step of disabling said edge transition detection circuit further comprises the steps of:

inputing said flash clear output signal to a logic element having an input and an output; and connecting said output of said logic element to said edge transition detection circuit.

3. The method of claim 1 wherein said edge transition detection circuit comprises a plurality of control transistors connected in parallel, each said control transistor having a control electrode, source and drain.

4. The method of claim 3 wherein said control transistors comprise n-channel MOS transistors.

5. The method of claim 3 wherein the step of disabling said edge transition detection circuit during operation of said flash clear cycle further comprises the step of driving the sources of said control transistors to a first logic state.

6. The method of claim 5 wherein the step of enabling said edge transition detection circuit after completion of said flash clear cycle, further comprises the step of driving said sources of said control transistors to a second logic state.

7. The method of claim 6 wherein said first logic state is high and said second logic state is low.

8. A system for disabling a signal path in an integrated circuit device, comprising:

a first circuit means disposed within the integrated circuit device, for generating an edge transition detection pulse responsive to a transition at one of a plurality of inputs of the integrated circuit device;

second circuit means for generating a flash clear signal; and a logic means disposed within the integrated circuit device, having an input connected to said second circuit means to receive the flash clear signal therefrom, and an output connected to said first circuit means, for disabling the first circuit means responsive to receiving the flash clear signal.

9. The system of claim 8 wherein said logic means comprises a logic element.

10. The system of claim 9 wherein said logic element comprises a logic gate.

11. The circuit of claim 10 wherein said logic gate comprises an inverter.

12. The system of claim 8 wherein said first circuit means comprises an edge transition detection circuit.

13. The system of claim 12 wherein said edge transition detection circuit comprises a plurality of control transistors connected in parallel, each said control transistor having a control electrode, source and drain.

14. The system of claim 13 wherein said control transistors comprise n-channel MOS transistors.

15. The system of claim 13 wherein the output of said logic means drives the sources of said control transistors to a first logic state.

16. The system of claim 15 wherein the output of said logic means drives the sources of said control transistors to a second logic state after driving said sources to said first logic state.

17. The system of claim 16 wherein said first logic state is high and said second logic state is low.

18. A circuit for disabling a signal path in an integrated circuit device, comprising:

an edge transition detection circuit: and a logic element having an input connected to receive a flash clear input signal, and having an output connected to said edge transition detection circuit, said logic element for disabling said edge transition detection circuit responsive to receiving the flash clear input signal.

19. The circuit of claim 18 wherein said edge transition detection circuit comprises a plurality of control transistors connected in parallel, each said control transistor having a control electrode, source and drain.

20. The circuit of claim 19 wherein said control transistors comprise n-channel MOS transistors.

21. A circuit for disabling a signal path in an integrated circuit device, comprising:

an edge transition detection circuit, wherein said edge transition detection circuit comprises a plurality of control transistors connected in parallel, each said control transistor having a control electrode, source and drain; and a logic element having an input connected to receive an input signal, and having an output connected to said edge transition detection circuit, said logic element for disabling said edge transition detection circuit responsive to receiving the input signal, wherein the output of said logic element drives the sources of said control transistors to a first logic state.

22. The circuit of claim 21 wherein the output of said logic element drives the sources of said control transistors to a second logic state after driving said sources to said first logic state.

23. The system of claim 22 wherein said first logic state is high and said second logic state is low.

* * * * *